(12) United States Patent
Tsutsumi et al.

(10) Patent No.: US 9,245,866 B2
(45) Date of Patent: Jan. 26, 2016

(54) ANTENNA DEVICE AND WIRELESS APPARATUS

(75) Inventors: Yukako Tsutsumi, Kawasaki (JP); Takayoshi Ito, Yokohama (JP); Shuichi Obayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 13/542,149

(22) Filed: Jul. 5, 2012

(65) Prior Publication Data

US 2012/0319913 A1 Dec. 20, 2012

Related U.S. Application Data

(63) Continuation-in-part of application No. PCT/JP2010/000007, filed on Jan. 5, 2010.

(51) Int. Cl.
*H01Q 1/38* (2006.01)
*H01L 23/00* (2006.01)
(Continued)

(52) U.S. Cl.
CPC ............... *H01L 24/49* (2013.01); *H01L 23/48* (2013.01); *H01L 23/66* (2013.01); *H01Q 1/2266* (2013.01); *H01Q 1/241* (2013.01); *H01Q 5/342* (2015.01); *H01Q 7/00* (2013.01); *H01Q 23/00* (2013.01); *H01L 23/49816* (2013.01); *H01L 24/48* (2013.01); *H01L 2223/6677* (2013.01); *H01L 2224/48227* (2013.01); *H01L 2224/48265* (2013.01); *H01L 2224/48465* (2013.01); *H01L 2224/49113* (2013.01); *H01L 2224/49171* (2013.01); *H01L 2224/49177* (2013.01);
(Continued)

(58) Field of Classification Search
CPC ......... H01Q 1/38; H01Q 11/12; H01Q 7/005; H01Q 23/00
USPC ................... 343/700 MS, 788, 866, 744, 870
See application file for complete search history.

(56) References Cited

U.S. PATENT DOCUMENTS 2,283,914 A * 5/1942 Carter ........................... 343/804
5,422,650 A * 6/1995 Hill .............................. 343/713
(Continued)

FOREIGN PATENT DOCUMENTS

JP 05-327329 12/1993
JP 08-088581 4/1996
(Continued)

OTHER PUBLICATIONS

Office Action issued Oct. 3, 2013 in counterpart Japanese Patent Application No. 2011-548852 and English-language translation thereof.
(Continued)

*Primary Examiner* — Dieu H Duong
(74) *Attorney, Agent, or Firm* — Nixon & Vanderhye, P.C.

(57) ABSTRACT

According to one embodiment, an antenna device includes a feeding portion, first and second wire-like metal portions, third and fourth plate-like metal portions and a fifth metal portion. One ends of the first and second wire-like metal portions are connected to the feeding portion. The third and fourth plate-like metal portions are respectively connected to the other ends of the first and second metal portions and disposed separately from each other with a predetermined distance therebetween. The fifth metal portion is configured to connect the third metal portion to the fourth metal portion. A total electrical length of the first to fifth metal portions is 3/2 wavelength at operating frequency band.

17 Claims, 8 Drawing Sheets

(51) Int. Cl.
*H01L 23/48* (2006.01)
*H01L 23/66* (2006.01)
*H01Q 1/22* (2006.01)
*H01Q 1/24* (2006.01)
*H01Q 7/00* (2006.01)
*H01Q 23/00* (2006.01)
*H01Q 5/342* (2015.01)
*H01L 23/498* (2006.01)

(52) U.S. Cl.
CPC . *H01L2924/01004* (2013.01); *H01L 2924/014* (2013.01); *H01L 2924/01005* (2013.01); *H01L 2924/01006* (2013.01); *H01L 2924/01013* (2013.01); *H01L 2924/01014* (2013.01); *H01L 2924/01029* (2013.01); *H01L 2924/01031* (2013.01); *H01L 2924/01032* (2013.01); *H01L 2924/01033* (2013.01); *H01L 2924/01079* (2013.01); *H01L 2924/09701* (2013.01); *H01L 2924/15311* (2013.01); *H01L 2924/15787* (2013.01); *H01L 2924/15788* (2013.01); *H01L 2924/19041* (2013.01); *H01L 2924/19051* (2013.01); *H01L 2924/3011* (2013.01); *H01L 2924/30107* (2013.01); *H01L 2924/30111* (2013.01)

(56) References Cited

U.S. PATENT DOCUMENTS

| | | | |
|---|---|---|---|
| 5,682,143 A | | 10/1997 | Brady et al. |
| 5,786,626 A | | 7/1998 | Brady et al. |
| 6,078,259 A | | 6/2000 | Brady et al. |
| 6,137,453 A | * | 10/2000 | Wang et al. ............ 343/895 |
| 6,271,793 B1 | | 8/2001 | Brady et al. |
| 6,662,430 B2 | | 12/2003 | Brady et al. |
| 7,295,161 B2 | | 11/2007 | Gaucher et al. |
| 7,329,950 B2 | | 2/2008 | Khorram |
| 7,518,221 B2 | | 4/2009 | Gaucher et al. |
| 7,545,329 B2 | | 6/2009 | Gaucher et al. |
| 7,559,131 B2 | | 7/2009 | Credelle et al. |
| 7,580,001 B2 | | 8/2009 | Tsai et al. |
| 7,586,193 B2 | | 9/2009 | Weste |
| 7,619,529 B2 | | 11/2009 | Goff et al. |
| 7,768,456 B2 | | 8/2010 | Tsutsumi et al. |
| 8,330,259 B2 | | 12/2012 | Soler Castany et al. |
| 2006/0033664 A1 | | 2/2006 | Soler et al. |
| 2006/0256018 A1 | | 11/2006 | Soler et al. |
| 2007/0120742 A1 | | 5/2007 | Soler et al. |
| 2007/0200708 A1 | * | 8/2007 | Hayama et al. ............ 340/572.7 |
| 2007/0273600 A1 | * | 11/2007 | Tsujimura et al. ............ 343/787 |
| 2008/0158094 A1 | * | 7/2008 | Rofougaran ............ 343/873 |
| 2008/0231518 A1 | * | 9/2008 | Tsutsumi et al. ...... 343/700 MS |
| 2009/0085810 A1 | | 4/2009 | Soler et al. |

FOREIGN PATENT DOCUMENTS

| | | |
|---|---|---|
| JP | 08-213419 | 8/1996 |
| JP | 10-013296 | 1/1998 |
| JP | WO 2004/042868 | 5/2004 |
| JP | 2005-228226 | 8/2005 |
| JP | 2006-505973 | 2/2006 |
| JP | 2008-167036 | 7/2008 |
| JP | 2008-259250 | 10/2008 |
| WO | 96/13793 | 5/1996 |

OTHER PUBLICATIONS

Tsutsumi, U.S. Appl. No. 12/004,480, filed Dec. 21, 2007.
International Search Report for PCT/JP2010/000007, mailed Apr. 27, 2010.

* cited by examiner

|  | λ/2 mode | λ mode | 3λ/2 mode | 2λ mode | 5λ/2 mode |
|---|---|---|---|---|---|
| FIG. 2A | 1160MHz | 2480MHz | 3480MHz | 4720MHz | 5560MHz |
| FIG. 3A | 1200MHz | 2450MHz | 3075MHz | 3890MHz | 4875MHz |
| FIG. 3B | 1050MHz | 1970MHz | 3150MHz | 4950MHz | 5550MHz |

FIG. 15

ANTENNA DEVICE AND WIRELESS APPARATUS

CROSS-REFERENCE TO RELATED APPLICATION(S)

This is a Continuation-In-Part application of PCT Application No. PCT/JP2010/000007, filed on Jan. 5, 2010, which was published under PCT Article 21(2) in Japanese, the entire contents of which are incorporated herein by reference.

BACKGROUND

Technical Field

Embodiments relate generally to an antenna device and a wireless apparatus.

DETAILED DESCRIPTION

Embodiments according to the invention will be described below with reference to the drawings. In the embodiments described below, it is assumed that parts designated by the same numerals perform similar operations, and redundant descriptions thereof will be omitted.

According to one embodiment, an antenna device includes a feeding portion, first and second wire-like metal portions, third and fourth plate-like metal portions and a fifth metal portion. One ends of the first and second wire-like metal portions are connected to the feeding portion. The third and fourth plate-like metal portions are respectively connected to the other ends of the first and second metal portions and disposed separately from each other with a predetermined distance therebetween. The fifth metal portion is configured to connect the third metal portion to the fourth metal portion. A total electrical length of the first to fifth metal portions is 3/2 wavelength at operating frequency band.

(First Embodiment)

Figure 1:
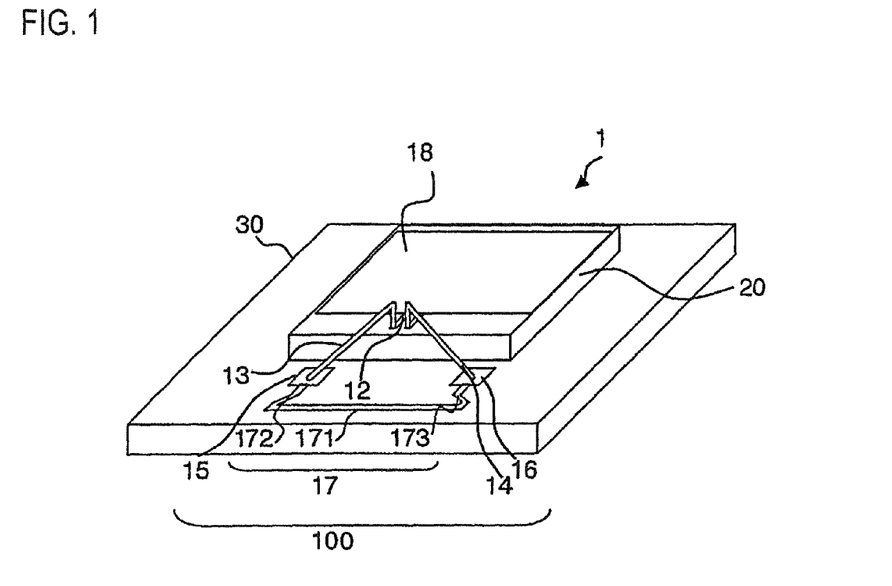
FIG. 1 is an exemplary view showing a wireless apparatus 1 according to a first embodiment.

A wireless apparatus 1 according to a first embodiment will be described. FIG. 1 is a view showing the configuration of the wireless apparatus 1. The wireless apparatus 1 includes an antenna device 100 and a wireless chip 20 for performing wireless communication via the antenna device 100. Also, the wireless apparatus 1 includes a dielectric board 30. The wireless chip 20 is mounted on one surface of the dielectric board 30.

The antenna device 100 includes a feeding portion 12 disposed on the wireless chip 20, first and second metal portions 13 and 14 one ends of which are respectively connected to the feeding portion 12, and third and fourth metal portions 15 and 16 formed on the surface of the dielectric board 30 on which the wireless chip 20 is mounted. The third metal portion 15 is connected to the other end of the first metal portion 13. The fourth metal portion 16 is connected to the other end of the second metal portion 14. Widths of the third and fourth metal portions 15 and 16 are wider than those of the first and second metal portions 13 and 14. The antenna device 100 includes a fifth metal portion 17 formed on the dielectric board 30 and electrically connecting the third and fourth metal portions 15 and 16. Also, the antenna device 100 includes a ground plane 18 on the wireless chip 20.

The wireless chip 20 is a rectangular semiconductor chip in which an insulating layer is formed on a substrate made of, for example, silicon, silicon germanium or gallium arsenic, and circuit patterns made of copper, aluminum or gold are further formed thereon. Alternatively, the wireless chip 20 may be a dielectric board, a magnetic substrate, a metal or a combination of these.

The dielectric board 30 is, for example, an epoxy substrate, a glass substrate or a ceramic substrate, being rectangular in shape. The dielectric board 30 may be a semiconductor substrate, a magnetic substrate or a combination of these.

The first and second metal portions 13 and 14 are wire-like elements formed of a conductor, such as gold, aluminum or copper. In the example of FIG. 1, the first and second metal portions 13 and 14 are each formed of a bonding wire. One end of the first metal portion 13 is connected to the feeding portion 12, and the other end thereof is connected to the third metal portion 15. One end of the second metal portion 14 is connected to the feeding portion 12, and the other end thereof is connected to the fourth metal portion 16. The widths of the first and second metal portions 13 and 14 are herein defined as the widths of the wire-like elements. Specifically, in the case that the first and second metal portions 13 and 14 are bonding wires, the diameters of the bonding wires are defined as the widths of the first and second metal portions 13 and 14.

The third and fourth metal portions 15 and 16 are elements formed of a conductor, such as gold, aluminum or copper, and are formed on the surface of the dielectric board 30 on which the wireless chip 20 is mounted. In the example of FIG. 1, the third and fourth metal portions 15 and 16 are plate-like elements having a square shape. In the case that the plate-like elements have a rectangular shape, the widths of the third and fourth metal portions 15 and 16 are the lengths of the short sides thereof. In FIG. 1, the length of one side of each of the third and fourth metal portions 15 and 16 is the width thereof. The third and fourth metal portions 15 and 16 are respectively connected to the other ends of the first and second metal portions 13 and 14 and are disposed separately from each other by a predetermined distance therebetween.

The fifth metal portion 17 is an element formed of a conductor, such as gold, aluminum or copper. In the example of FIG. 1, the fifth metal portion 17 is a wire-like element formed on the surface of the dielectric board 30 on which the wireless chip 20 is mounted. The fifth metal portion 17 includes a first wire-like element 171 provided in parallel with the wireless chip 20, a second wire-like element 172 one end of which is connected to the third metal portion 15 and the other end of which is connected to one end of the first wire-like element 171, and a third wire-like element 173 one end of which is connected to the fourth metal portion 16 and the other end of which is connected to the other end of the first wire-like element 171. The second and third wire-like elements 172 and 173 are disposed so as to be connected to the first wire-like element 171 on the opposite side of the wireless chip 20 across the third and fourth metal portions 15 and 16. The fifth metal portion 17 is used to connect the third metal portion 15 to the fourth metal portion 16.

The antenna device 100 operates as a loop antenna formed of the feeding portion 12 and the first to fifth metal portions 13 to 17.

Furthermore, a total electrical length d0 of the first to fifth metal portions 13 to 17 (hereafter referred to as an electrical length of the antenna device 100) is 3/2 wavelengths at the operating frequency of the antenna device 100. A total electrical length d1 of the third to fifth metal portions 15 to 17 is ¼ or more and ¾ or less (d0/4≤d1≤3·d0/4) of the electrical length d0 of the antenna device 100. A length of a linear section of the fifth metal portion 17, that is, a length of the first wire-like element 171 is longer than the distance between the third metal portion 15 and the fourth metal portion 16. An electrical length of the first wire-like element 171 may be equal to the distance between the third metal portion 15 and the fourth metal portion 16.

Figure 2A:
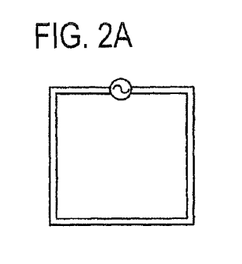
FIG. 2A is an exemplary view illustrating the operation principle of an antenna device 100.

The operation principle of the antenna device 100 will be described with reference to FIGS. 2A to 2F. FIG. 2A shows a square loop antenna in a free space. This is electrically equivalent to the case in which the third and fourth metal portions 15 and 16 of the antenna device 100 shown in FIG. 1 are wire-like elements, one ends of the third and fourth metal portions 15 and 16 are respectively connected to ends of the first and second metal portions 13 and 14, and the other ends of the third and fourth metal portions 15 and 16 are respectively connected to both ends of the fifth metal portion 17. However, for the purpose of describing the principle thereof, the electrical length d0 of the antenna is not limited to the 3/2 wavelength.

FIGS. 2B to 2F are exemplary views showing standing waves of currents that are generated in the square loop antenna shown in FIG. 2A at different frequencies.

Figure 2B:
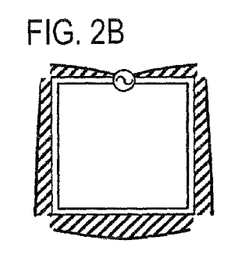
FIG. 2B is an exemplary view showing a standing wave of a current generated on a square loop antenna in a 1/2 wavelength mode.
Figure 2C:
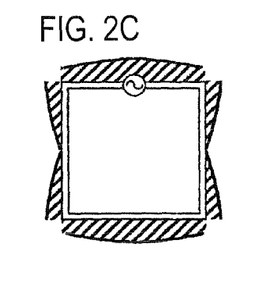
FIG. 2C is an exemplary view showing a standing wave of a current generated on the square loop antenna in a 1 wavelength mode.
Figure 2D:
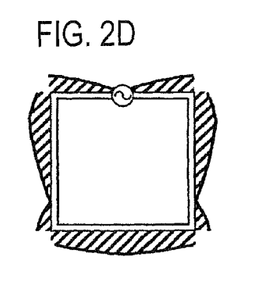
FIG. 2D is an exemplary view showing a standing wave of a current generated on the square loop antenna in a 3/2 wavelength mode.
Figure 2E:
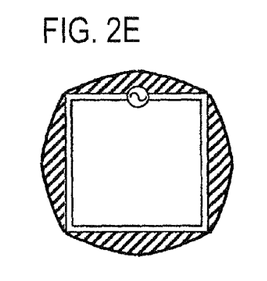
FIG. 2E is an exemplary view showing a standing wave of a current generated on the square loop antenna in a 2 wavelength mode.
Figure 2F:
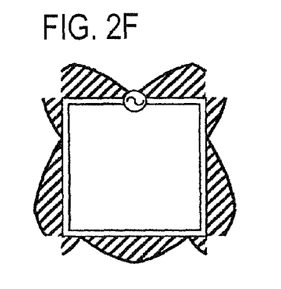
FIG. 2F is an exemplary view showing a standing wave of a current generated on the square loop antenna in a 5/2 wavelength mode.

In the square loop antenna shown in FIG. 2B, a standing wave in which a single current node is present at the feeding point thereof and a single current antinode is present is generated most intensely. The case in which a half wavelength standing wave is generated most intensely as described above is referred to as a 1/2 wavelength mode. In FIG. 2C, a standing wave in which two current nodes and two current antinodes are present is generated most intensely. The case in which a 1 wavelength standing wave is generated most intensely as described above is referred to as a 1 wavelength mode. In FIG. 2D, a standing wave in which three current nodes and three current antinodes are present is generated most intensely. The case in which a 3/2 wavelength standing wave is generated most intensely as described above is referred to as a 3/2 wavelength mode. In FIG. 2E, a standing wave in which four current nodes and four current antinodes are present is generated most intensely. The case in which a 2 wavelength standing wave is generated most intensely as described above is referred to as a 2 wavelength mode. In FIG. 2F, a standing wave in which five current nodes and five current antinodes are present is generated most intensely. The case in which a 5/2 wavelength standing wave is generated most intensely as described above is referred to as a 5/2 wavelength mode.

As understood from FIGS. 2B to 2F, the nodes of the standing waves are present at the feeding points of the square loop antennas shown in FIGS. 2B, 2D and 2F. Hence, the input impedances when viewed from the feeding points of the square loop antennas shown in FIGS. 2B, 2D and 2F are large. The nodes of the standing waves are not present at the feeding points of the square loop antennas shown in FIGS. 2C and 2E. Hence, the input impedances when viewed from the feeding points of the square loop antennas shown in FIGS. 2C and 2E are smaller than those of the square loop antennas shown in FIGS. 2B, 2D and 2F.

When discontinuous points are provided in the square loop antenna shown in FIG. 2, the electromagnetic field thereof is disturbed at discontinuous points, and it seems that a capacitance is added to the antenna. For example, when a plate-like element is provided in part of a wire-like element as in the antenna device 100, the widths of the first to fifth metal portions 15 to 17 are not constant at the connection points between the first and third connection points 13 and 15 and the connection points between the second and fourth connection points 14 and 16. The point at which the width of the antenna is changed as described above is referred to as a discontinuous point. In the case that such a discontinuous point is present, influence of the discontinuous point on the antenna will be described.

Figure 3A:
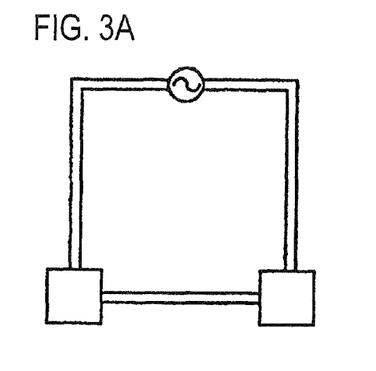
FIG. 3A is a view showing an example in which discontinuous points are provided in the square loop antenna shown in FIG. 2E.
Figure 3B:
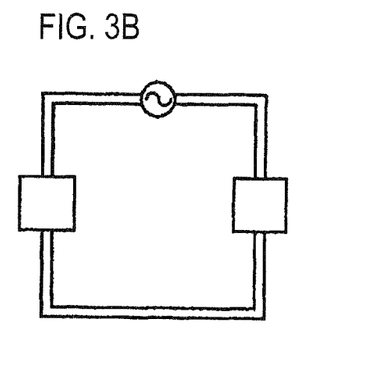
FIG. 3B is a view showing an example in which discontinuous points are provided in the square loop antenna shown in FIG. 2C.

FIGS. 3A and 3B show examples in which discontinuous points are provided in the square loop antennas shown in FIGS. 2E and 2C, respectively. FIG. 3A shows that current nodes (the current nodes shown in FIG. 2E) in the case that the square loop antenna operates in the 2 wavelength mode become discontinuous points. In other words, the third and fourth metal portions 15 and 16 are disposed at the current nodes in the case that the square loop antenna operates in the 2 wavelength mode. FIG. 3B shows that current nodes (the current nodes shown in FIG. 2C) in the case that the square loop antenna operates in the 1 wavelength mode become discontinuous points. The third and fourth metal portions 15 and 16 are disposed at the current nodes when the square loop antenna operates in the 1 wavelength mode. The square loop antenna shown in FIG. 3B is electrically equivalent to the antenna device 100 shown in FIG. 1.

Figure 4:
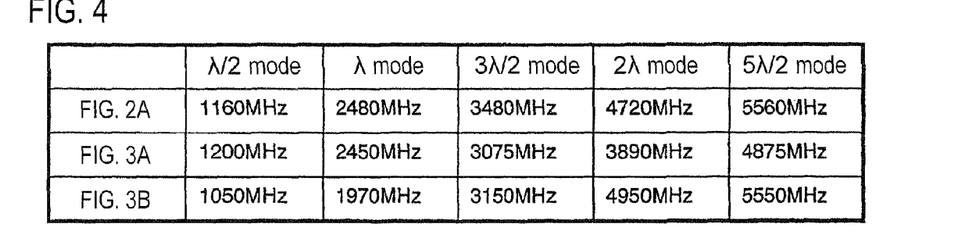
FIG. 4 is a view showing frequencies at which respective wavelength modes are generated.

It is assumed that the physical circumferential lengths of the antennas shown in FIGS. 2A, 3A and 3B are 132 mm. FIG. 4 shows a frequency, obtained by an electromagnetic field simulation, at which each wavelength mode occurs. The physical circumferential length of an antenna is equal to the physical length of the elements of the antenna.

As shown in FIG. 4, a frequency fb at which the 1/2 wavelength mode occurs in the square loop antenna shown in FIG. 2A is fb=1,160 MHz, a frequency fc at which the 1 wavelength mode occurs is fc=2,480 MHz, a frequency fd at which the 3/2 wavelength mode occurs is fd=3,480 MHz, a frequency fe at which the 2 wavelength mode occurs is fe=4,720 MHz, and a frequency ff at which the 5/2 wavelength mode occurs is ff=5,560 MHz.

As shown in FIG. 4, the frequency fb at which the 1/2 wavelength mode occurs in the square loop antenna shown in FIG. 3A is fb=1,200 MHz, the frequency fc at which the 1 wavelength mode occurs is fc=2,450 MHz, the frequency fd at which the 3/2 wavelength mode occurs is fd=3,075 MHz, the frequency fe at which the 2 wavelength mode occurs is fe=3,890 MHz, and the frequency ff at which the 5/2 wavelength mode occurs is ff=4,875 MHz.

As shown in FIG. 4, the frequency fb at which the 1/2 wavelength mode occurs in the square loop antenna shown in FIG. 3B is fb=1,050 MHz, the frequency fc at which the 1 wavelength mode occurs is fc=1,970 MHz, the frequency fd at which the 3/2 wavelength mode occurs is fd=3,150 MHz, the frequency fe at which the 2 wavelength mode occurs is fe=4,950 MHz, and the frequency ff at which the 5/2 wavelength mode occurs is ff=5,550 MHz.

If discontinuous points are present at the current nodes for the operation in the 2 wavelength mode as shown in FIG. 3A, the frequency fe at which the 2 wavelength mode occurs becomes low. Specifically, the frequency fe at which the 2 wavelength mode occurs is fe=4,720 MHz when no discontinuous point is present (FIG. 2A); on the other hand, fe is 3,890 MHz when the discontinuous points are present (FIG. 3A), that is, the frequency fe is lower by 830 MHz. The changes in the frequencies at which the other wavelength modes occur are relatively small. For example, the frequency fc at which the 1 wavelength mode occurs is f=2,480 MHz when no discontinuous point is present (FIG. 2A); on the other hand, fc is 2,450 MHz when the discontinuous points are present (FIG. 3A), that is, the frequency is lower by 30 MHz.

If discontinuous points are present at the current nodes for the operation in the 1 wavelength mode as shown in FIG. 3B, the frequency fc at which the 1 wavelength mode occurs becomes low. Specifically, the frequency fc at which the 1 wavelength mode occurs is fc=2,480 MHz when no discontinuous point is present (FIG. 2A); on the other hand, fc is 1,970 MHz when the discontinuous points are present (FIG. 3B), that is, the frequency fc is lower by 510 MHz. The changes in the frequencies at which the other wavelength modes occur are relatively small. For example, the frequency fe at which the 2 wavelength mode occurs is fe=4,720 MHz when no discontinuous point is present (FIG. 2A); on the other hand, fe is 4,950 MHz when the discontinuous points are present (FIG. 3B), that is, the change of the frequency is approximately 230 MHz.

If such discontinuous points are present at current nodes for the operation in an n/2 wavelength mode (n is an integer) as described above, the frequency at which the n/2 wavelength mode occurs is lowered.

Each wavelength mode occurs most intensely at the frequency shown in FIG. 4, but also occurs intensely at frequencies therearound with a constant width. In other words, in the case of the square loop antenna shown in FIG. 2A, the 1/2 wavelength mode occurs most intensely at fb=1,160 MHz; however, as the frequency becomes higher, the 1/2 wavelength mode becomes smaller gradually, and the 1 wavelength mode becomes larger gradually instead. In the case of the square loop antenna shown in FIG. 2A, the 1/2 wavelength mode mainly occurs in a constant range around fb=1,160 MHz. Furthermore, the 1 wavelength mode mainly occurs in a constant range around fc=2,480 MHz.

As described above, if discontinuous points are provided at the current nodes for the operation in the 2 wavelength mode, the frequency fe at which the 2 wavelength mode occurs most intensely becomes low, but the frequency fc at which the 1 wavelength mode occurs most intensely does not change significantly. Hence, if discontinuous points are provided at the current nodes for the operation in the 2 wavelength mode, the frequency range in which the 3/2 wavelength mode mainly occurs becomes narrower than that in the case where no discontinuous point is provided. On the other hand, for example, if discontinuous points are provided at the current nodes for the operation in the 1 wavelength mode, the frequency fc at which the 1 wavelength mode occurs most intensely becomes low, but the frequency fe at which the 2 wavelength mode occurs most intensely does not change significantly. Hence, if discontinuous points are provided at the current nodes for the operation in the 1 wavelength mode, the frequency range in which the 3/2 wavelength mode mainly occurs becomes wider than that in the case in which no discontinuous point is provided.

Very high production technology is required to connect the feeding portion 12 provided on the wireless chip 20 to the fifth metal portion 17 provided on the dielectric board 30 using the first and second metal portions 13 and 14 serving as wire-like elements. Then, in the antenna device 100, the wire-like first metal portion 13 is connected to the fifth metal portion 17 via the plate-like third metal portion 15, whereby the antenna device 100 can be produced relatively easily.

However, in the case that such plate-like elements are provided in part of the wire-like antenna, discontinuous points are generated as described above, and there is a possibility that the frequency range (bandwidth) of the wavelength mode in which operation is desired to be performed becomes narrow. For example, in the case that the antenna device 100 is desired to be operated in the 3/2 wavelength mode, if the third and fourth metal portions 15 and 16 are disposed at the current nodes of the 2 wavelength mode as shown in FIG. 3A, the frequency range in which the 3/2 wavelength mode mainly occurs becomes narrower than that in the case in which the metal portions are not provided.

In order to mainly operate in the 3/2 wavelength mode, the antenna device 100 according to the first embodiment has the electrical length d0 equal to the 3/2 wavelength at the operating frequency, and has the third and fourth metal portions 15 and 16 disposed at positions in which the electrical length d1 of the portions formed of the third to fifth metal portions 15 to 17 is ¼ or more and ¾ or less (d0/4≤d1≤3·d0/4) of the electrical length d0 of the antenna device 100. The input impedance of the antenna device 100 can be increased significantly by operating the antenna device 100 mainly in the 3/2 wavelength mode. Furthermore, the third and fourth metal portions 15 and 16 are prevented from being disposed at the current nodes of the 2 wavelength mode by disposing the third and fourth metal portions 15 and 16 so that d0/4≤d1≤3·d0/4 is obtained. The third and fourth metal portions 15 and 16 are prevented from being disposed at the current nodes of the 2 wavelength mode more securely by making the antenna device 100 symmetrical with respect to a straight line passing through the feeding portion 12.

Figure 5:
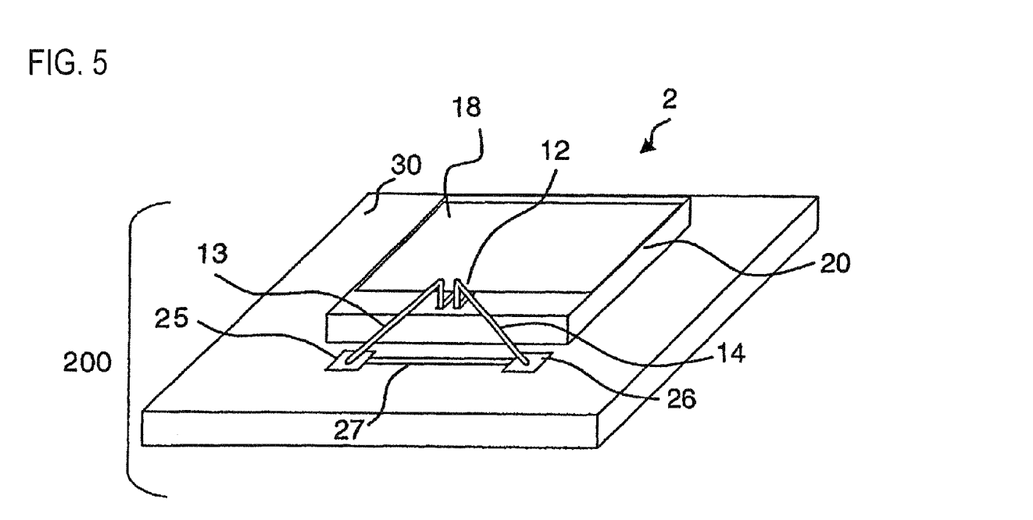
FIG. 5 is an exemplary view showing an antenna device shown in FIG. 3A.

Next, simulation results of the antennas shown in FIGS. 3A and 3B will be described using FIGS. 5 to 7. FIG. 5 is an exemplary view showing a wireless apparatus 2 having an antenna device 200 electrically equivalent to the square loop antenna shown in FIG. 3A. The wireless apparatus 2 is the same as the wireless apparatus 1 except for disposed positions of third and fourth metal portions 25 and 26 and a shape of a fifth metal portion 27. The third and fourth metal portions 25 and 26 are provided at current nodes for the case where the antenna device 200 operates in the 2 wavelength mode, as shown in FIG. 3A. The fifth metal portion 27 is a linear element for connecting the third and fourth metal portions 25 and 26. An antenna device being electrically equivalent to the square loop antenna shown in FIG. 3B is the antenna device 1 shown in FIG. 1. Thus, description thereon will be omitted.

Figure 6A:
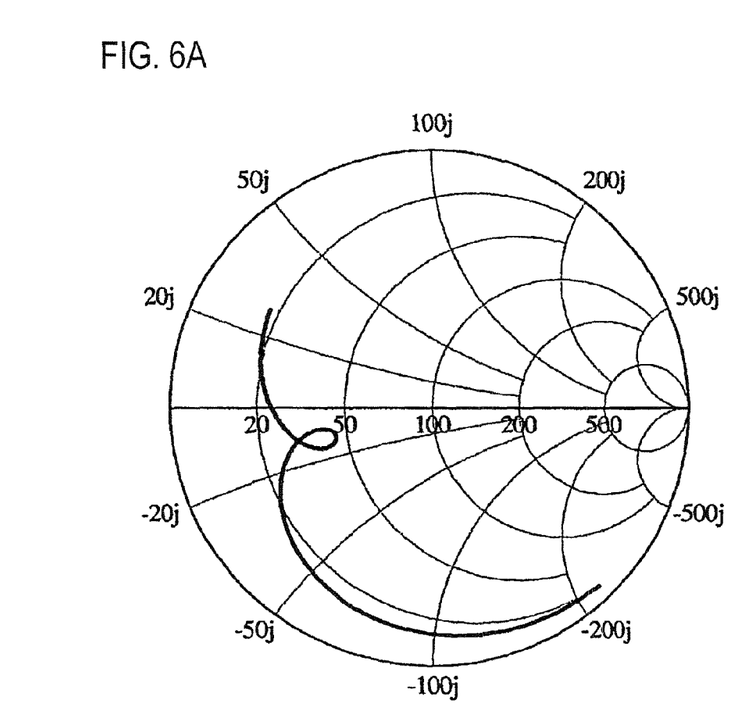
FIGS. 6A and 6B are exemplary views showing simulation results of the antenna devices shown in FIGS. 5 and 1, respectively.
Figure 6B:
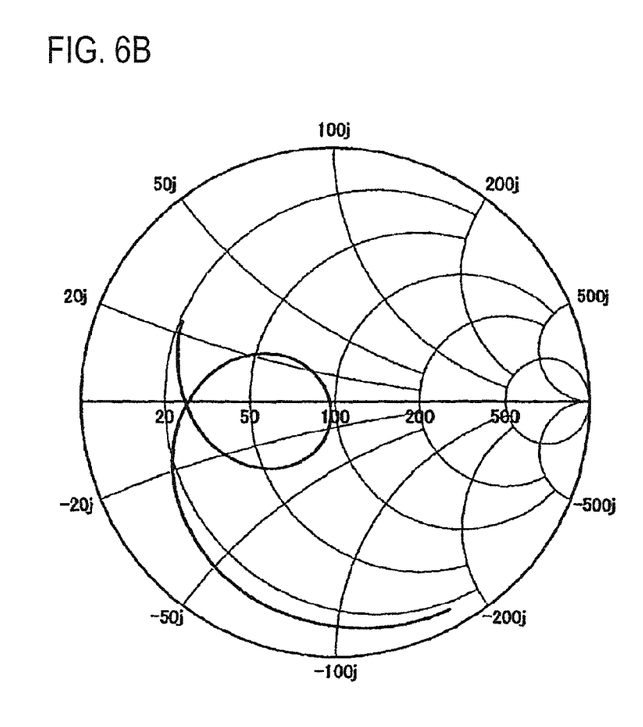

FIGS. 6A and 6B are Smith charts of the antenna devices 10 and 20 shown in FIGS. 1 and 5. FIG. 6A is the Smith chart of the antenna device 200 shown in FIG. 5, and FIG. 6B is the Smith chart of the antenna device 100 shown in FIG. 1.

It can be understood from FIG. 6A that a frequency range in which the 3/2 wavelength mode is dominant is narrow in the antenna device 200 and that the 1 wavelength mode has immediately changed to the 2 wavelength mode in the antenna device 200. Furthermore, an input impedance of the antenna device 200 is low as a whole. On the other hand, it can be understood from FIG. 6B that a frequency range in which the 3/2 wavelength mode is dominant in the antenna device 100 is wider than that in the antenna device 200 and that a locus passes through the vicinity of the center of the Smith chart at the frequency at which the parallel resonance in the 3/2 wavelength mode occurs.

Figure 7A:
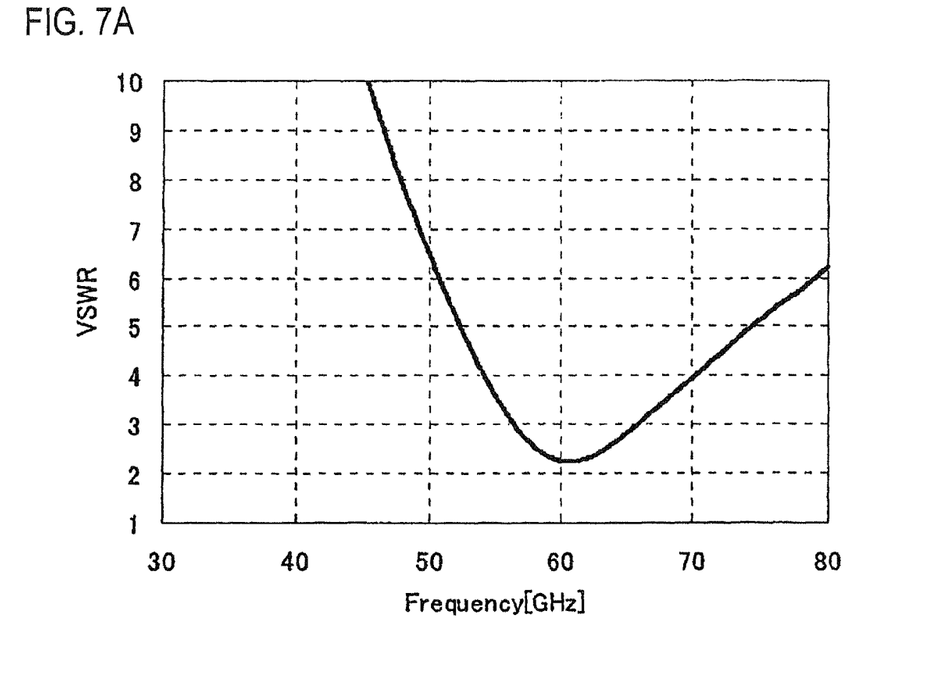
FIGS. 7A and 7B are exemplary views showing simulation results of the antenna devices shown in FIGS. 5 and 1, respectively.
Figure 7B:
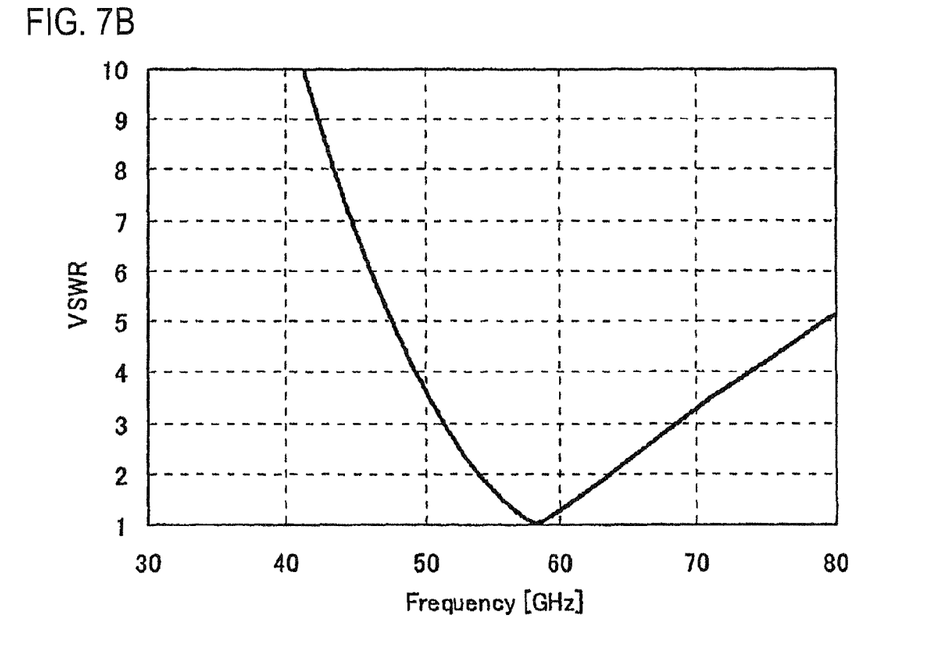

FIGS. 7A and 7B show VSWRs (voltage standing wave ratios) of the antenna devices 10 and 20 shown in FIGS. 5 and 1, respectively. FIG. 7A shows the VSWR of the antenna device 200 shown in FIG. 5. FIG. 7B shows the VSWR of the antenna device 100 shown in FIG. 1.

It can be understood from FIG. 7A that, although the 3/2 wavelength mode occurs most intensely at 62.5 GHz, that the frequency range in which the VSWR is 2 or less is not obtained, that the frequency range in which the VSWR is 3 or less is from 59.4 GHz to 64.4 GHz, and that a fractional bandwidth is 8.1% (the center frequency: 61.9 GHz). It can be understood from FIG. 7B that the 3/2 wavelength mode occurs most intensely at 58.5 GHz, that the frequency range in which the VSWR is 2 or less is from 53.8 GHz to 63.7 GHz, that a fractional bandwidth is 16.9% (the center frequency: 58.8 GHz), that a frequency range in which the VSWR is 3 or less is 51.3 GHz to 68.6 GHz, and that a fractional bandwidth is 28.9% (the center frequency: 60.0 GHz). In comparison with the results shown in FIG. 7A, the frequency fractional bandwidth in which the VSWR is 3 or less is widened significantly by 3.7 times.

As described above, in the wireless apparatus 1 according to the first embodiment, the input impedance of the antenna device 100 can be increased by setting the electrical length of the antenna device 100 to the 3/2 wavelength at the operating frequency, whereby the matching characteristics of the antenna device 100 can be improved.

Furthermore, the bandwidth of the antenna device 100 can be widened by setting the total electrical length d1 of the third to fifth metal portions 15 to 17 to be ¼ or more and ¾ or less ($d0/4 \leq d1 \leq 3 \cdot d0/4$) of the electrical length d0 of the antenna device 100.

Moreover, even in the case where the distance between the third and fourth metal portions 15 and 16 is shortened so that the third and fourth metal portions 15 and 16 are disposed away from the wireless chip 20, the total electrical length d1 of the third to fifth metal portions 15 to 17 can be made longer by making the length of the linear section of the fifth metal portion 17, that is, the length of the first wire-like element 171, longer than the distance between the third and fourth metal portions 15 and 16.

The operating frequency is defined as a frequency of a signal that is input from the wireless chip 20 to the feeding portion 12. Or the operating frequency is defined as a frequency of a signal that is output from the feeding portion 12 to the wireless chip 20.

(Modified Example)

Figure 8:
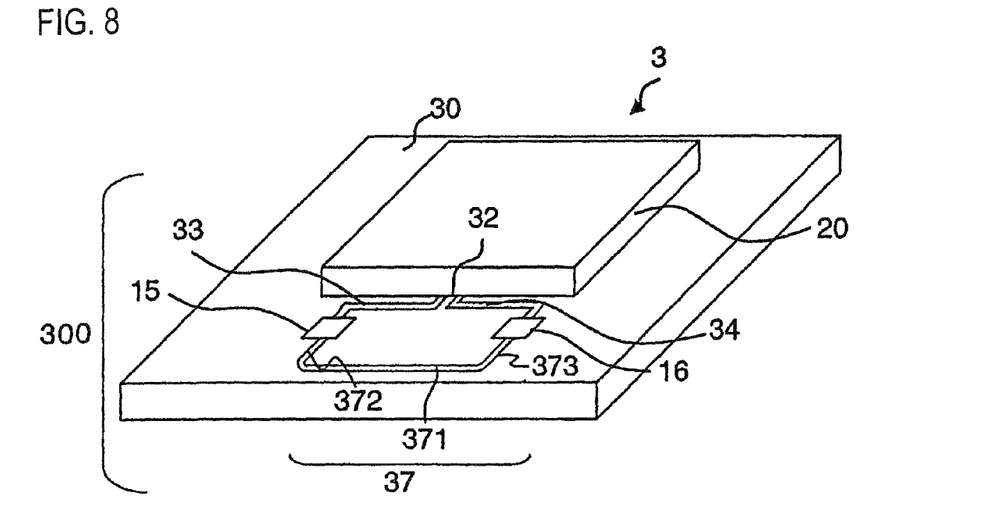
FIG. 8 is an exemplary view showing a modified example of the wireless apparatus 1.

FIG. 8 shows a wireless apparatus 3 according to a modified example of the first embodiment. The wireless apparatus 3 has the same configuration as that of the wireless apparatus 1 shown in FIG. 1, except that the wireless apparatus 3 has a feeding portion 32, first and second metal portions 33 and 34 and a fifth metal portion 37 and does not have the ground plane 18. The ground plane may be provided between the wireless chip 20 and the dielectric board 30, although the ground plane is not shown in FIG. 8.

The feeding portion 12 shown in FIG. 1 is provided on a surface (an example of a second surface) of the wireless chip 20 on the opposite side of the surface, of the wireless chip 20, contacting with the dielectric board 30. The feeding portion 32 according to this modified example is provided on the surface, of the wireless chip 20, contacting with the dielectric board 30.

The first and second metal portions 33 and 34 are wire-like elements formed of a conductor, such as gold, aluminum or copper. In the example of FIG. 8, the first and second metal portions 33 and 34 are formed on the dielectric board 30. One end of the first metal portion 33 is connected to the feeding portion 32, and the other end thereof is connected to the third metal portion 15. One end of the second metal portion 34 is connected to the feeding portion 32, and the other end thereof is connected to the fourth metal portion 16.

The fifth metal portion 37 is an element formed of a conductor, such as gold, aluminum or copper. In the example of FIG. 8, the fifth metal portion 37 is formed on the dielectric board 30. The fifth metal portion 37 has a first wire-like element 371 provided in parallel with the wireless chip 20, a second wire-like element 372 one end of which is connected to the third metal portion 15 and the other end of which is connected to one end of the first wire-like element 371, and a third wire-like element 373 one end of which is connected to the fourth metal portion 16 and the other end of which is connected to the other end of the first wire-like element 371. The one ends of the second and third wire-like elements 372 and 373 are bent.

As described above, the located position of the feeding portion 32 and the shapes of the first to fifth metal portions are not limited to those shown in FIG. 1, but an antenna device 300 may be formed on the dielectric board 30 as shown in FIG. 8.

(Second Embodiment)

Figure 9:
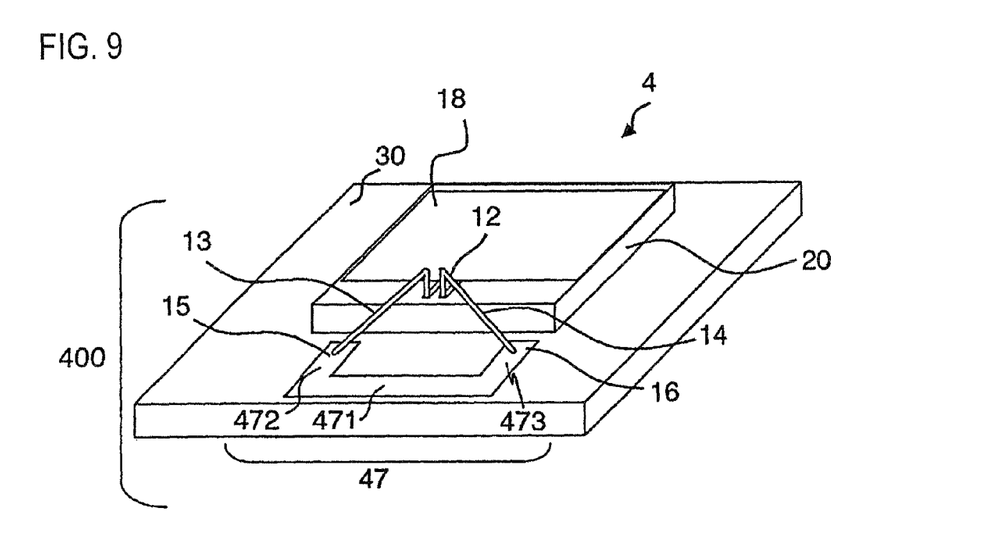
FIG. 9 is an exemplary view showing a wireless apparatus 4 according to a second embodiment.

FIG. 9 shows a wireless apparatus 4 according to a second embodiment. The wireless apparatus 4 has the same configuration as that of the wireless apparatus 1 shown in FIG. 1, except for a fifth metal portion 47 of an antenna device 400.

The fifth metal portion 47 is a plate-like element formed of a conductor, such as gold, aluminum or copper. In the example of FIG. 9, the fifth metal portion 47 is formed on the dielectric board 30. A width of the fifth metal portion 47 is equal to those of the third and fourth metal portions 15 and 16.

The fifth metal portion 47 has a first plate-like element 471 provided in parallel with the wireless chip 20, a second plate-like element 472 one end of which is connected to the third metal portion 15 and the other end of which is connected to one end of the first plate-like element 471, and a third plate-like element 473 one end of which is connected to the fourth metal portion 16 and the other end of which is connected to the other end of the first plate-like element 471.

An electrical length of the first plate-like element 471 may be longer than the distance between the third metal portion 15 and the fourth metal portion 16. FIG. 9 shows the case where the electrical length of the first plate-like element 471 is equal to the distance between the third metal portion 15 and the fourth metal portion 16. As in this case, the electrical length of the first plate-like element 471 may be equal to the distance between the third metal portion 15 and the fourth metal portion 16.

As described above, according to the second embodiment, a matching characteristics of the antenna device 400 can be improved as in the case of the first embodiment. Also, a bandwidth of the antenna device 400 can be widened. Furthermore, according to the second embodiment, the width of the fifth metal portion 47 can be adjusted by making the fifth metal portion 47 into a plate-like shape. Therefore, the antenna device 400 can be provided on the dielectric board 30, for example, even in the case that a width of a line to be provided has been determined to be a constant width or more.

The third to fifth metal portions 15, 16 and 47 may be formed of a single metal portion by making the width of the fifth metal portion 47 equal to those of the third and fourth metal portions 15 and 16.

(Third Embodiment)

Figure 10:
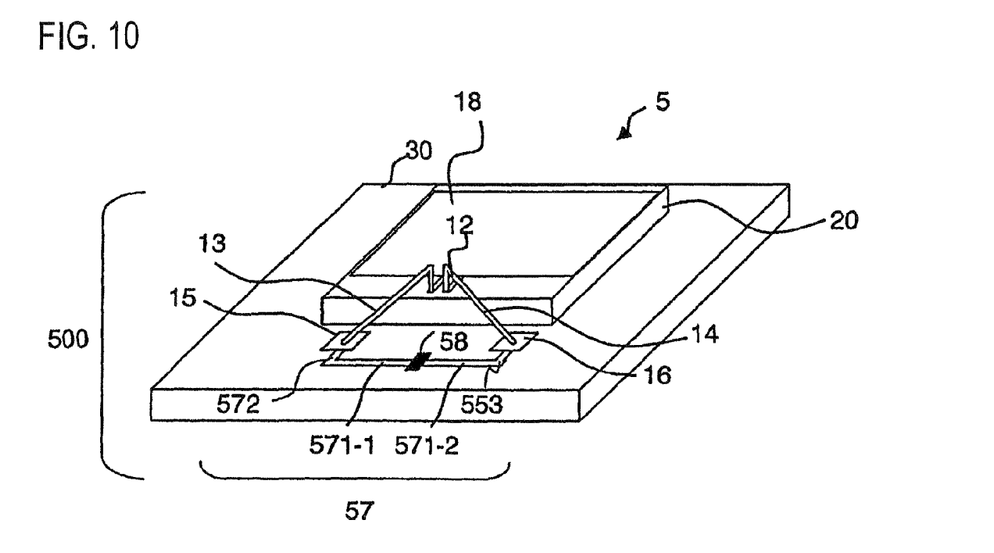
FIG. 10 is an exemplary view showing a wireless apparatus 5 according to a third embodiment.

FIG. 10 shows a wireless apparatus 5 according to a third embodiment. The wireless apparatus 5 has the same configuration as that of the wireless apparatus 1 shown in FIG. 1, except for a fifth metal portion 57 and an inductor 58 of an antenna device 500.

The inductor 58 is an element formed of a conductor, such as gold, aluminum or copper. The fifth metal portion 57 is a wire-like element formed of a conductor, such as gold, aluminum or copper. In the example of FIG. 10, the fifth metal portion 57 is formed on the dielectric board 30.

The fifth metal portion 57 has first wire-like elements 571-1 and 571-2 provided in parallel with the wireless chip 20, a second wire-like element 572 one end of which is connected to the third metal portion 15 and the other end of which is connected to one end of the first wire-like element 571-1, and a third wire-like element 573 one end of which is connected to the fourth metal portion 16 and the other end of which is connected to one end of the first wire-like element 571-2. The inductor 58 is connected to the other end of the first wire-like element 571-1 and to the other end of the first wire-like element 571-2. In other words, the inductor 58 is provided between the first wire-like elements 571-1 and 571-2.

As described above, according to the third embodiment, a matching characteristics of the antenna device 500 can be improved as in the case of the first embodiment. In addition, providing the inductor 58 can make an electrical length of the fifth metal portion 57 longer and make the antenna device 500 compact. If the inductor 58 is provided at the current antinode shown in FIG. 2D, the most significant effect is obtained. In other words, the inductor 58 may be provided at such a position that a total electrical length d2-1 of the first metal portion 13, the third metal portion 15, the first wire-like element 571-1 and the second wire-like element 572 is equal to a total electrical length d2-2 of the second metal portion 14, the fifth metal portion 16, the first wire-like element 571-2 and the third wire-like element 573.

An effect similar to that of the third embodiment is obtained even if a capacitor (not shown) is provided instead of the inductor 58. In this case, if the capacitor is provided at the current node shown in FIG. 2D, the most significant effect is obtained.

(Fourth Embodiment)

Figure 11:
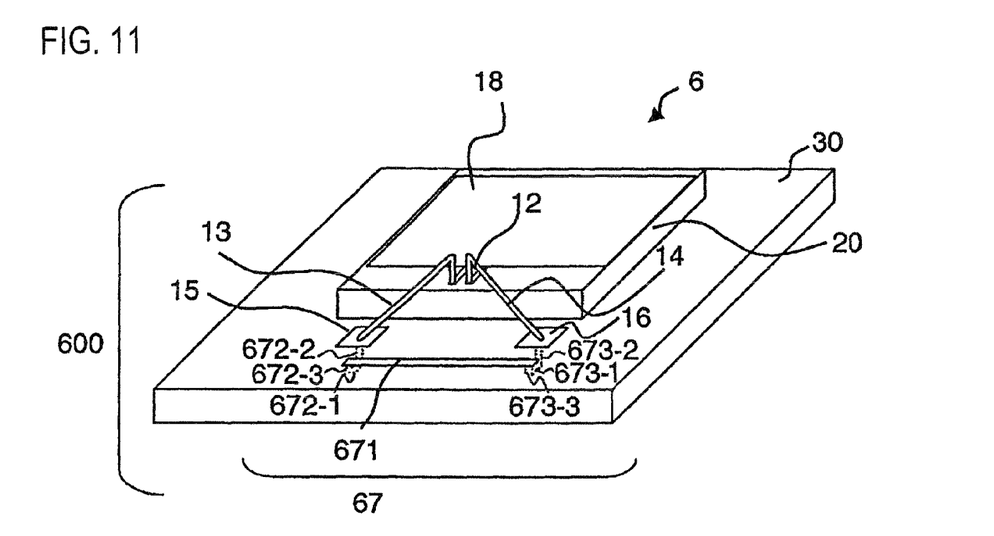
FIG. 11 is an exemplary view showing a wireless apparatus 6 according to a fourth embodiment.

FIG. 11 shows a wireless apparatus 6 according to a fourth embodiment. The wireless apparatus 6 has the same configuration as that of the wireless apparatus 1 shown in FIG. 1, except for a fifth metal portion 67 of an antenna device 600.

The fifth metal portion 67 has a first wire-like element 671 provided in parallel with the wireless chip 20, a second wire-like element 672 one end of which is connected to the third metal portion 15 and the other end of which is connected to one end of the first plate-like element 671, and a third wire-like element 673 one end of which is connected to the fourth metal portion 16 and the other end of which is connected to the other end of the first wire-like element 671.

The second wire-like element 672 includes a wire-like element 672-1 provided on a surface (rear surface) of the dielectric board 30 on the opposite side of the surface thereof on which the wireless chip 20 is provided or inside the dielectric board 30, a via hole 672-2 through which one end of the wire-like element 672-1 is connected to the third metal portion 15, and a via hole 672-3 through which the other end of the wire-like element 672-1 is connected to the one end of the first wire-like element 671.

The third wire-like element 673 includes a wire-like element 673-1 provided on the surface (rear surface) of the dielectric board 30 on the opposite side of the surface thereof on which the wireless chip 20 is provided or inside the dielectric board 30, a via hole 673-2 through which one end of the wire-like element 673-1 is connected to the fourth metal portion 16, and a via hole 673-3 through which the other end of the wire-like element 673-1 is connected to the other end of the first wire-like element 671.

As described above, according to the fourth embodiment, a matching characteristics of the antenna device 600 can be improved as in the case of the first embodiment. Also, since part of the fifth metal portion 67 is provided on the rear surface of the dielectric board 30 or in the dielectric board 30, the wiring of the antenna device 600 provided on the front surface can be reduced.

(Fifth Embodiment)

Figure 12:
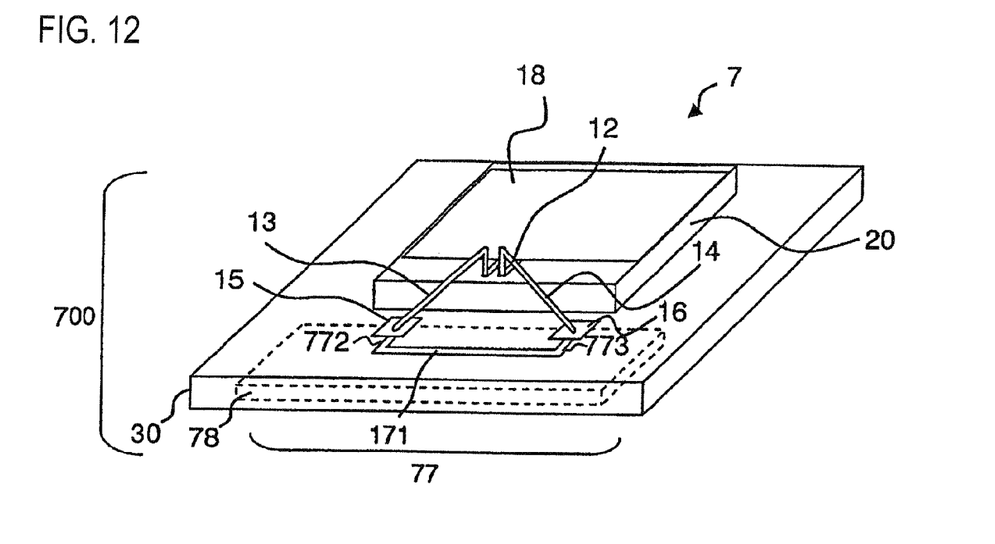
FIG. 12 is an exemplary view showing a wireless apparatus 7 according to a fifth embodiment.

FIG. 12 shows a wireless apparatus 7 according to a fifth embodiment. The wireless apparatus 7 has the same configuration as that of the wireless apparatus 1 shown in FIG. 1, except that a dielectric slab 78 is provided and except for a shape of a fifth metal portion 77 of an antenna device 700.

The fifth metal portion 77 is different from the fifth metal portion 17 shown in FIG. 1 in that a length of the first wire-like element 171 is equal to or shorter than the distance between the third and fourth metal portions 15 and 16. Second and third wire-like elements 772 and 773 are connected to the first wire-like element 171 substantially perpendicularly.

A dielectric slab 78 is provided under the dielectric board 30 and under the antenna device 700. In the example of FIG. 12, the dielectric slab 78 has a plate-like shape and is provided in substantially parallel with the wireless chip 20. When viewed from above the surface (front surface) of the dielectric board 30 on which the wireless chip 20 is provided, a region in which the fifth metal portion 77 at least partially overlaps the dielectric slab 78. The dielectric slab 78 may be different in dielectric constant from the dielectric board 30 and may be provided inside the dielectric board 30.

As described above, according to the fifth embodiment, a matching characteristics of the antenna device 700 can be improved as in the case of the first embodiment. Also, since the dielectric slab 78 is provided under the fifth metal portion 77, an effective dielectric constant of the fifth metal portion 77 can be increased, and an electrical length of the fifth metal portion 77 can be made longer. Thereby, the antenna device 700 can be made compact.

In the fifth embodiment, the antenna device 700 is made compact by providing the dielectric slab 78 under the dielectric board 30 of the wireless apparatus 1 shown in FIG. 1. However, the dielectric slab 78 may be provided under any of the dielectric boards 30 of the wireless apparatuses shown in FIGS. 8 to 11. In the case of the wireless apparatus 6 shown in FIG. 11, the wire-like elements 672-1 and 673-1 may be provided inside the dielectric board 30, and the dielectric slab 78 may be provided at a lower level than the wire-like elements 672-1 and 673-1 (in a direction away from the wireless chip 20). Also, a magnetic substance may be provided instead of the dielectric slab 78. With this configuration, an effective magnetic permeability of the fifth metal portion 77 can be enhanced, and an electrical length of the fifth metal portion 77 can be made longer.

(Sixth Embodiment)

Figure 13:
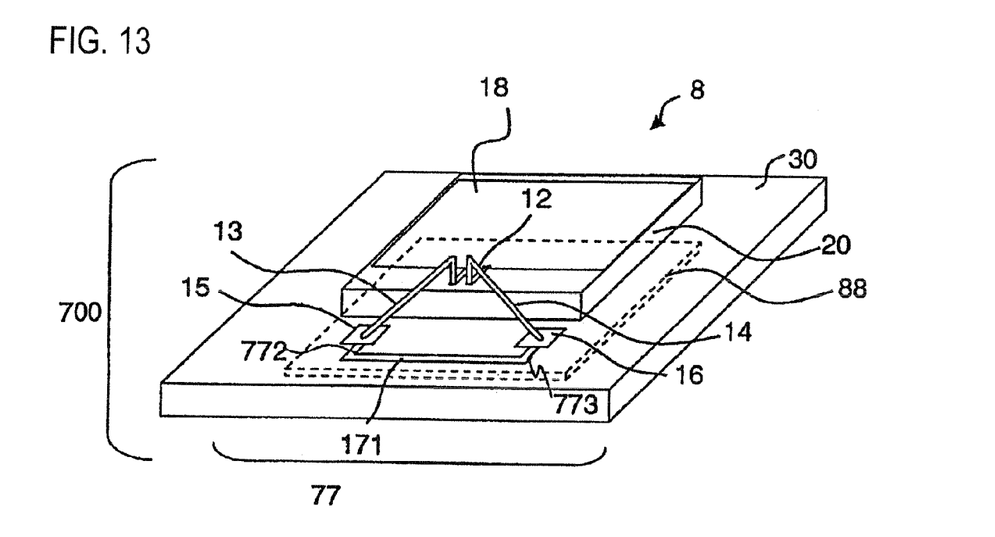
FIG. 13 is an exemplary view showing a wireless apparatus 8 according to a sixth embodiment.

FIG. 13 shows a wireless apparatus 8 according to a sixth embodiment. The wireless apparatus 8 has the same configuration as that of the wireless apparatus 7 shown in FIG. 12 except that the wireless apparatus 8 includes a metal portion 88 instead of the dielectric slab 78.

Like the dielectric slab 78 shown in FIG. 12, the metal portion 88 is provided under the dielectric board 30 and under the antenna device 700. The metal portion 88 is a plate-like element formed of a conductor, such as gold, aluminum or copper. In the example of FIG. 13, the metal portion 88 is also disposed under the wireless chip 20. However, the metal portion 88 may be disposed only under the fifth metal portion 77 as in the case of FIG. 12. In other words, when viewed from above the surface (front surface) of the dielectric board 30 on which the wireless chip 20 is provided, the region in which at least the fifth metal portion 77 is formed at least partially overlaps the metal portion 88, and a size of the metal portion 88 is arbitrarily chosen.

As described above, according to the sixth embodiment, a matching characteristics of the antenna device 800 can be improved as in the case of the first embodiment. Also, since the metal portion 88 is provided under the fifth metal portion 77, a floating capacitance is generated between the fifth metal portion 77 and the metal portion 88, and an electrical length of the fifth metal portion 77 can be made longer. Thereby, the antenna device 700 can be made compact.

In the sixth embodiment, the antenna device 700 is made compact by providing the metal portion 88 under the dielectric board 30. However, the metal portion 88 may be provided inside the dielectric board 30.

(Seventh Embodiment)

Figure 14:
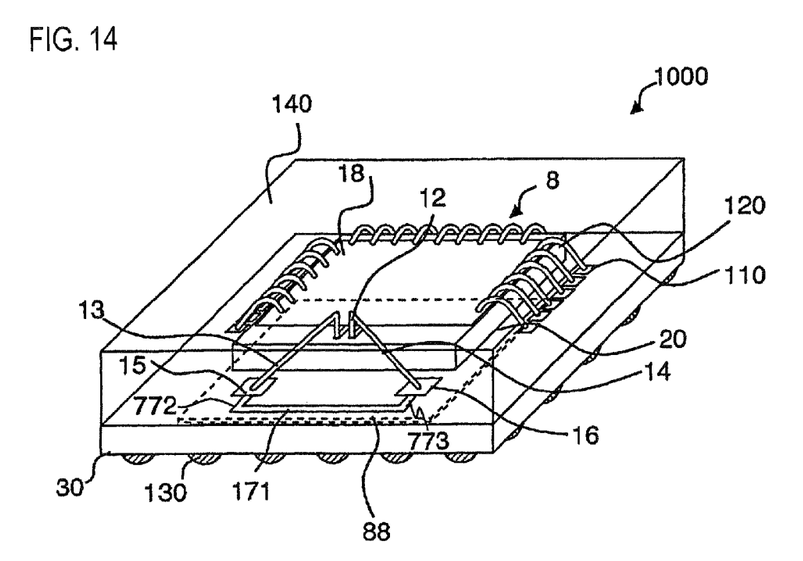
FIG. 14 is an exemplary view showing a semiconductor package 1000 according to a seventh embodiment.

FIG. 14 shows a semiconductor package 1000 according to a seventh embodiment. The semiconductor package 1000 has the wireless apparatus 8 shown in FIG. 14, metal pads 110 provided on the dielectric board 30, bonding wires 120 connecting the metal pads 110 to the wireless chip 20, and solder balls 130 provided on the rear surface of the dielectric board 30. The elements (the wireless chip 20, the antenna device 700, the metal pads 110 and the bonding wires 120) provided on the front surface of the dielectric board 30 are sealed with a sealing material 140.

On the front surface of the dielectric board 30, wiring (although not shown) connected to the metal pads 110 is provided. The wireless chip 20 is connected to the wiring via the bonding wires 120, thereby being connected to another circuit chip (not shown). Instead of the bonding wires 120, bumps or solder balls may be used for the connection between the wireless chip 20 and the wiring.

As described above, according to the seventh embodiment, the matching characteristics of the antenna device 700 can be improved as in the case of the first embodiment, and the antenna device 700 can be provided inside the semiconductor package 1000. With this configuration, it is not necessary to provide the antenna device separate from the semiconductor package, thereby space saving in a printed circuit board, for example, can be achieved.

In the seventh embodiment, the semiconductor package 1000 having the wireless apparatus 8 shown in FIG. 13 is described. However, a semiconductor packages having any of the wireless apparatuses 1, and 3 to 7 shown in FIGS. 1 and 8 to 12 can also be achieved.

(Eighth Embodiment)

Figure 15:
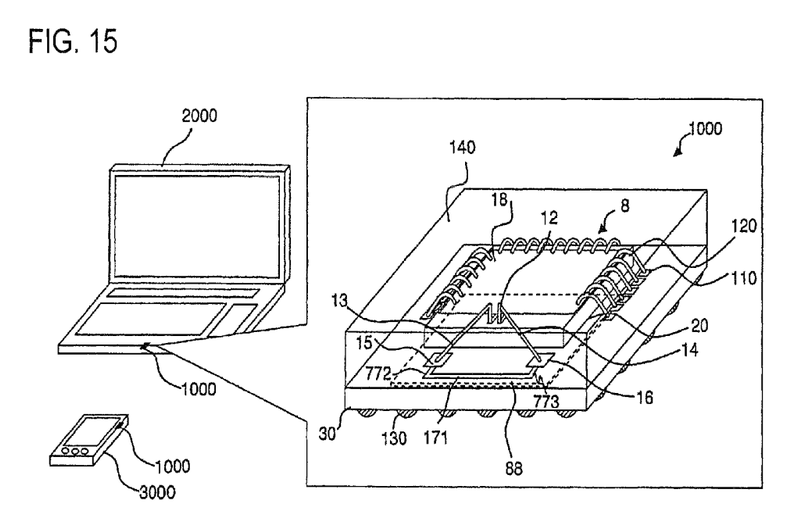
FIG. 15 is an exemplary view showing communication devices 2000 and 3000 according to an eighth embodiment.

FIG. 15 shows communication devices 2000 and 3000 according to an eighth embodiment. The communication devices 2000 and 3000 are apparatuses for performing short-distance communication, such as a notebook PC, a mobile phone and a PDA (personal digital assistance). FIG. 15 shows an example in the case that a notebook PC 2000 communicates with a mobile terminal 3000. Each of the wireless apparatuses 2000 and 3000 according to the eighth embodiment has the semiconductor package 1000 shown in FIG. 14.

The semiconductor package 1000 is provided inside a housing of the notebook PC 2000 in which a keyboard, etc. are disposed. The semiconductor package 1000 is disposed so that the antenna device 700 is located as close to the housing as possible, for example.

Also, the semiconductor package 1000 is provided inside the mobile terminal 3000. In this case, the semiconductor package is disposed so that the antenna device 700 is located as close to the housing as possible.

The notebook PC 2000 communicates with the mobile terminal 3000 via the antenna device 700. In this case, the notebook PC 2000 and the mobile terminal 3000 can perform communication efficiently by placing the notebook PC and the mobile terminal 3000 so that the antenna devices 700 of the notebook PC 2000 and the mobile terminal 3000 face each other.

The arrangement of the semiconductor packages 1000 is not limited to the example shown in FIG. 15. For example, the semiconductor package 1000 may be provided inside the housing of the notebook PC 2000 in which a liquid-crystal display is disposed. Since the antenna device 700 is provided inside the semiconductor package 1000 as described above, the antenna device 700 can be disposed in a communication device 2000, 3000 at a position where an antenna device cannot usually be disposed. Furthermore, it is not necessary to dispose the semiconductor package and the antenna device separately. Thereby, a wireless communication function can easily be provided for communication devices.

FIG. 15 shows an example in which the semiconductor package 1000 having the wireless apparatus 8 is mounted in a communication device. However, a semiconductor package having any of the wireless apparatuses shown in FIGS. 1 and 9 to 14 may also be mounted.

The invention is not entirely limited to the above-mentioned embodiments, but can be embodied by modifying the components thereof within a range not departing from the spirit thereof in the embodiment stage thereof. In addition, various inventions can be formed by appropriately combining the plurality of components disclosed in the above-mentioned embodiments. For example, some of all the components described in the embodiments may be deleted. Furthermore, components of different embodiments may be combined appropriately.

What is claimed is:

1. An antenna device comprising:
    a feeding portion;
    first and second metal portions, first ends of which are connected to the feeding portion;
    third and fourth metal portions respectively connected to second ends of the first and second metal portions and disposed separately from each other with a predetermined distance therebetween; and
    a fifth metal portion configured to connect the third metal portion to the fourth metal portion, wherein
    the first to fifth metal portions are arranged so that a total electrical length thereof is 3/2 wavelength at operating frequency band and a standing wave node is formed proximate the feeding portion, wherein
    an electrical length of the third to fifth metal portions is ¼ or more of the total electrical length and ¾ or less of the total electrical length,
    a total length of the first and second metal portions is larger than the predetermined distance between the third and fourth metal portions,
    the first and third metal portions have different widths from each other at a connection portion therebetween so as to be discontinuous, and
    the second and fourth metal portions have different widths from each other at a connection portion therebetween so as to be discontinuous.

2. The antenna device according to claim 1, wherein the fifth metal portion includes
    a first element having a linear shape,
    a second element, a first end of which is connected to the third metal portion and a second end of which is connected to a first end of the first element, and
    a third element, a first end of which is connected to the fourth metal portion and a second end of which is connected to a second end of the first element, and
    an electrical length of the first element is longer than the predetermined distance between the third metal portion and the fourth metal portion.

3. The antenna device according to claim 1, wherein shapes of the first to fifth metal portions are symmetric with respect to a straight line passing through the feeding portion.

4. The antenna device according to claim 1, wherein the third and fourth metal portions are plate-like metal portions and the fifth metal portion includes a plate-like element having the same width as those of the third and fourth metal portions.

5. The antenna device according to claim 1, further comprising:
    an inductor disposed at a position where the fifth metal portion is divided into two parts.

6. A wireless apparatus comprising:
    a dielectric board;
    a wireless chip mounted on a first surface of the dielectric board; and
    an antenna device including
        a feeding portion,
        first and second metal portions, first ends of which are connected to the feeding portion, the first and second metal portions formed on the first surface;
        third and fourth metal portions respectively connected to second ends of the first and second metal portions, the third and fourth metal portions formed on the first surface, and
        a fifth metal portion, a first end of which is connected to the third metal portion and a second end of which is connected to the fourth metal portion, the fifth metal portion formed on the first surface, wherein
    the first to fifth metal portions are arranged so that a total electrical length thereof is 3/2 wavelength at operating frequency band and a standing wave node is formed proximate the feeding portion,
    an electrical length of the third to fifth metal portions is ¼ or more of the total electrical length and ¾ or less of the total electrical length,
    a total length of the first and second metal portions is larger than the predetermined distance between the third and fourth metal portions,
    the first and third metal portions have different widths from each other at a connection portion therebetween so as to be discontinuous, and
    the second and fourth metal portions have different widths from each other at a connection portion therebetween so as to be discontinuous.

7. The wireless apparatus according to claim 6, further comprising:
    a sixth metal portion provided inside the dielectric board, wherein
    when viewed from above the first surface of the dielectric board, the fifth metal portion at least partially overlaps the sixth metal portion.

8. The wireless apparatus according to claim 6, further comprising:
    a sixth metal portion provided on a second surface of the dielectric board, the second surface being opposite to the first surface, wherein
    when viewed from above the first surface of the dielectric board, the fifth metal portion at least partially overlaps the sixth metal portion.

9. The wireless apparatus according to claim 6, wherein the fifth metal portion includes
    a first element provided on the first surface,
    second and third elements provided inside the dielectric board,
    a first via hole configured to connect the third metal portion and a first end of the second element,
    a second via hole configured to connect a second end of the second element and a first end of the first element,
    a third via hole configured to connect the fourth metal portion and a first end of the third element, and
    a fourth via hole configured to connect a second end of the third element and a second end of the first element.

10. The wireless apparatus according to claim 6, wherein the fifth metal portion includes
    a first element provided on the first surface,
    second and third elements provided on a second surface of the dielectric board, the second surface being opposite to the first surface,
    a first via hole configured to connect the third metal portion and a first end of the second element,
    a second via hole configured to connect a second end of the second element and a first end of the first element,
    a third via hole configured to connect the fourth metal portion and a first end of the third element, and
    a fourth via hole configured to connect a second end of the third element and a second end of the first element.

11. The wireless apparatus according to claim 6, further comprising:
   a magnetic substance provided inside the dielectric board, wherein
   when viewed from above the first surface of the dielectric board, the fifth metal portion at least partially overlaps the magnetic substance.

12. The wireless apparatus according to claim 6 further comprising:
   a magnetic substance provided on a second surface of the dielectric board, the second surface being opposite to the first substrate, wherein
   when viewed from above the first surface of the dielectric board, the fifth metal portion at least partially overlaps the magnetic substance.

13. The wireless apparatus according to claim 6, further comprising:
   a dielectric slab provided inside the dielectric board, wherein
   when viewed from above the first surface of the dielectric board, the fifth metal portion at least partially overlaps the dielectric slab.

14. The wireless apparatus according to claim 13, wherein the dielectric slab is different in dielectric constant from the dielectric board.

15. The wireless apparatus according to claim 6, further comprising:
   a dielectric slab provided on a second surface of the dielectric board, the second surface being opposite to the first substrate, wherein
   when viewed from above the first surface of the dielectric board, the fifth metal portion at least partially overlaps the dielectric slab.

16. The wireless apparatus according to claim 15, wherein the dielectric slab is different in dielectric constant from the dielectric board.

17. A wireless apparatus comprising an antenna device according to claim 1.

* * * * *